(12) United States Patent
Kurashima et al.

(10) Patent No.: US 9,395,393 B2
(45) Date of Patent: Jul. 19, 2016

(54) CURRENT SENSOR

(71) Applicant: FUJITSU COMPONENT LIMITED, Tokyo (JP)

(72) Inventors: Shigemi Kurashima, Tokyo (JP); Shinichiro Akieda, Tokyo (JP); Nobuyoshi Shimizu, Tokyo (JP); Akio Nakamura, Tokyo (JP); Naoyuki Nagao, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 264 days.

(21) Appl. No.: 14/228,420

(22) Filed: Mar. 28, 2014

(65) Prior Publication Data
US 2014/0292309 A1 Oct. 2, 2014

(30) Foreign Application Priority Data

Apr. 1, 2013 (JP) ................... 2013-076483

(51) Int. Cl.
*G01R 1/20* (2006.01)
*G01R 11/30* (2006.01)
(Continued)

(52) U.S. Cl.
CPC ............... *G01R 15/202* (2013.01); *G01R 1/20* (2013.01); *G01R 1/22* (2013.01); *G01R 11/06* (2013.01); *G01R 15/20* (2013.01); *G01R 19/20* (2013.01); *G01R 21/08* (2013.01);
(Continued)

(58) Field of Classification Search
CPC .... G01R 7/06; G01R 19/0092; G01R 15/207; G01R 15/202; G01R 15/205; G01R 1/20; G01R 1/22; G01R 11/06; G01R 19/20; G01R 33/0283; G01R 15/20; G01R 21/08; G01R 33/075; G05G 2009/04755; G06G 7/162
USPC ...... 324/72, 76.11–76.83, 117 R, 117 H, 134, 324/137, 140, 144
See application file for complete search history.

(56) References Cited

U.S. PATENT DOCUMENTS

| | | | | | |
|---|---|---|---|---|---|
| 5,241,263 | A | * | 8/1993 | Naoi | ............. G01R 15/202 324/117 H |
| 6,271,744 | B1 | * | 8/2001 | McCarthy | ........... G01R 15/207 257/E27.005 |

(Continued)

FOREIGN PATENT DOCUMENTS

JP          2001-153895          6/2001

OTHER PUBLICATIONS

JP 2001-153895, Machine Translation, Aug. 6, 2001.*

*Primary Examiner* — Huy Q Phan
*Assistant Examiner* — Raul Rios Russo
(74) *Attorney, Agent, or Firm* — IPUSA, PLLC

(57) ABSTRACT

A current sensor includes semi-annular first and second magnetic cores, first and second sensors, and a differential output part. The first magnetic core is provided around a wire in which an electric current flows and includes a pair of first magnetic core parts each having a quarter annular shape. The first sensor is provided in the gap between the first magnetic core parts and detects a magnetic flux. The second magnetic core is provided around the wire and includes a pair of second magnetic core parts each having a quarter annular shape. The first and second magnetic cores form an annular magnetic core. The second sensor is provided in the gap between the second magnetic core parts and detects a magnetic flux. The differential output part outputs the differential output of the outputs of the first and second sensors.

6 Claims, 11 Drawing Sheets

(51) Int. Cl.
- *G01R 15/20* (2006.01)
- *G01R 19/20* (2006.01)
- *G01R 21/08* (2006.01)
- *G01R 11/06* (2006.01)
- *G01R 1/22* (2006.01)
- *G01R 33/028* (2006.01)
- *G01R 15/18* (2006.01)
- *G01R 33/07* (2006.01)
- *G05G 9/047* (2006.01)
- *G06G 7/162* (2006.01)

(52) U.S. Cl.
CPC ......... *G01R 33/0283* (2013.01); *G01R 33/075* (2013.01); *G05G 2009/04755* (2013.01); *G06G 7/162* (2013.01)

(56) References Cited

U.S. PATENT DOCUMENTS

| | | | | |
|---|---|---|---|---|
| 2005/0073293 | A1* | 4/2005 | Hastings | G01R 15/202 324/117 H |
| 2006/0043960 | A1* | 3/2006 | Itoh | G01R 15/202 324/117 R |
| 2008/0054881 | A1* | 3/2008 | Kim | G01R 19/165 324/117 R |
| 2012/0268108 | A1* | 10/2012 | Hozoi | G01R 15/202 324/202 |
| 2013/0169267 | A1* | 7/2013 | Miyakoshi | G01R 15/207 324/117 R |

\* cited by examiner

| ANALYSIS MODEL | | MAGNETIC FLUX DENSITY | | EFFECT OF DISTURBANCE MAGNETIC FLUX DENSITY |
|---|---|---|---|---|
| | | (mT)at FS | (mT / A) | (mT / mT) |
| CURRENT SENSOR FOR COMPARISON | | 34.1 | 0.68 | 1.130 |
| CURRENT SENSOR 100 | ONE SIDE | 19.4 | 0.388 | 4.680 |
| | DIFFERENTIAL | 38.8 | 0.776 | 0 |

FIG.7

| ITEM | | ACCURACY (LINEARITY) | HYSTERESIS (±50 A) |
|---|---|---|---|
| TARGET VALUE | | ±1 % FS | <100mV (2.5 % FS) |
| HALL IC OF COMPANY A | ROUND CORE | | |
| | DIFFERENTIAL OUTPUT | +0.4 % / −0.5 % | 31mV (0.8 % FS) |
| | OUTPUT OF CORE 10 OR 20 ALONE | +1.2 % / −1.0 % | 83mV (2.0 % FS) |

CURRENT SENSOR

CROSS-REFERENCE TO RELATED APPLICATION

The present application is based upon and claims the benefit of priority of Japanese Patent Application No. 2013-076483, filed on Apr. 1, 2013, the entire contents of which are incorporated herein by reference.

BACKGROUND OF THE INVENTION

1. Field of the Invention

The present invention relates to current sensors.

2. Description of the Related Art

For example, Japanese Laid-Open Patent Application No. 2001-153895 describes a current sensor that includes a case, a holder, a first and a second magnetic detection head, and a detector circuit. The case includes a U-shaped guide groove for guiding an electric wire. The holder is detachable from and reattachable to the case and includes a projecting part that fits into the U-shaped guide groove in order to hold the electric wire inserted into the U-shaped guide groove. The first and the second magnetic detection head face each other across the electric wire at equal intervals from the center of the electric wire in the case, and detect a magnetic field generated from the electric wire. The detector circuit converts a magnetic field acting on the first and the second magnetic detection head into voltage.

SUMMARY OF THE INVENTION

According to an aspect of the present invention, a current sensor includes semi-annular first and second magnetic cores, first and second sensors, and a differential output part. The first magnetic core is provided around a wire in which an electric current flows and includes a pair of first magnetic core parts each having a quarter annular shape. The first sensor is provided in the gap between the first magnetic core parts and detects a magnetic flux. The second magnetic core is provided around the wire and includes a pair of second magnetic core parts each having a quarter annular shape. The first and second magnetic cores form an annular magnetic core. The second sensor is provided in the gap between the second magnetic core parts and detects a magnetic flux. The differential output part outputs the differential output of the outputs of the first and second sensors.

According to an aspect of the present invention, a current sensor includes a pair of first magnetic core parts each having a quarter annular shape that form a semi-annular first magnetic core provided around a wire in which an electric current flows, a first sensor provided in a gap between the first magnetic core parts, configured to detect a magnetic flux and output a first output indicating the detected magnetic flux, a pair of second magnetic core parts each having a quarter annular shape that form a semi-annular second magnetic core provided around the wire, wherein the second magnetic core forms an annular magnetic core with the first magnetic core, and a second sensor provided in a gap between the second magnetic core parts, configured to detect a magnetic flux and output a second output indicating the detected magnetic flux.

BRIEF DESCRIPTION OF THE DRAWINGS

FIG. 7 is a table illustrating the linearity and hysteresis measured in the current sensor of the first embodiment;

DESCRIPTION OF THE EMBODIMENTS

Embodiments to which current sensors according to aspects of the present invention are applied are described below.

First Embodiment

Figure 1:
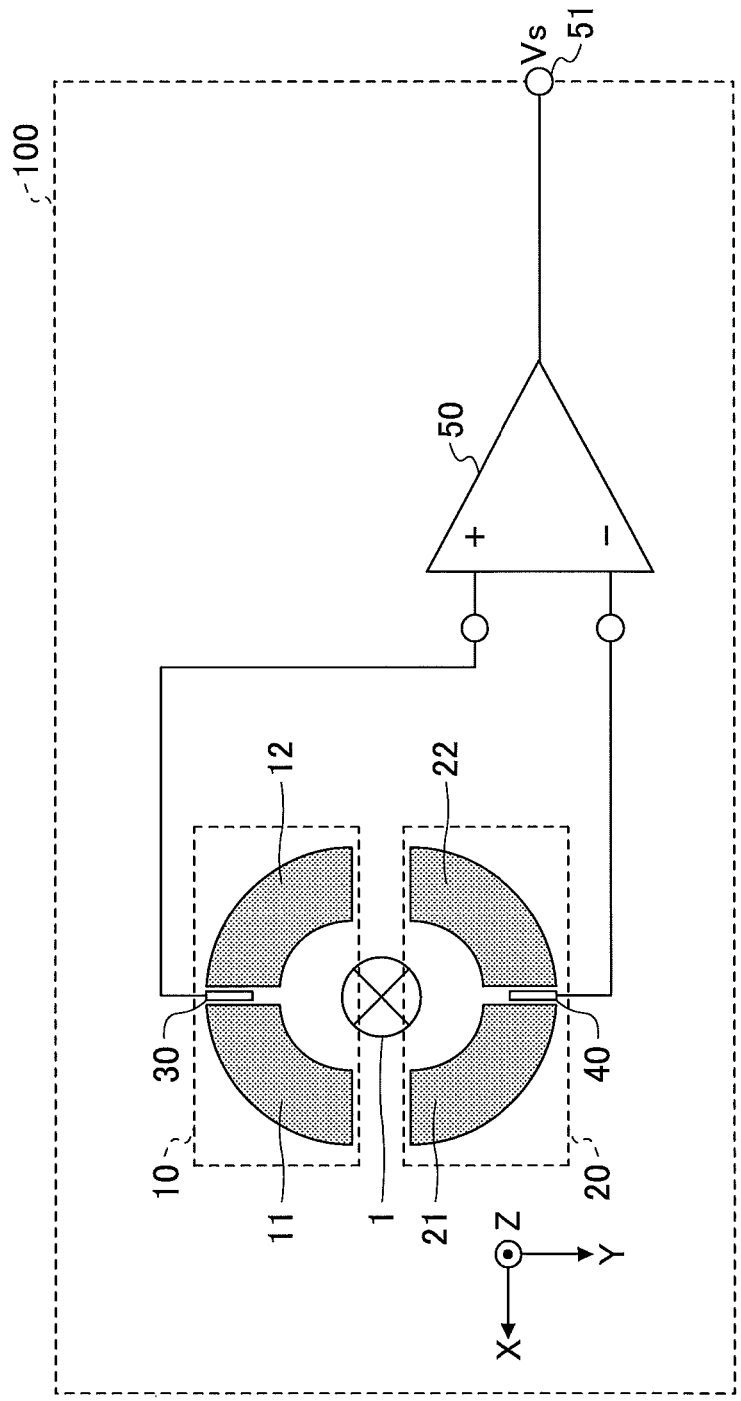
FIG. 1 is a diagram illustrating a current sensor according to a first embodiment.
Figures 2, 3:
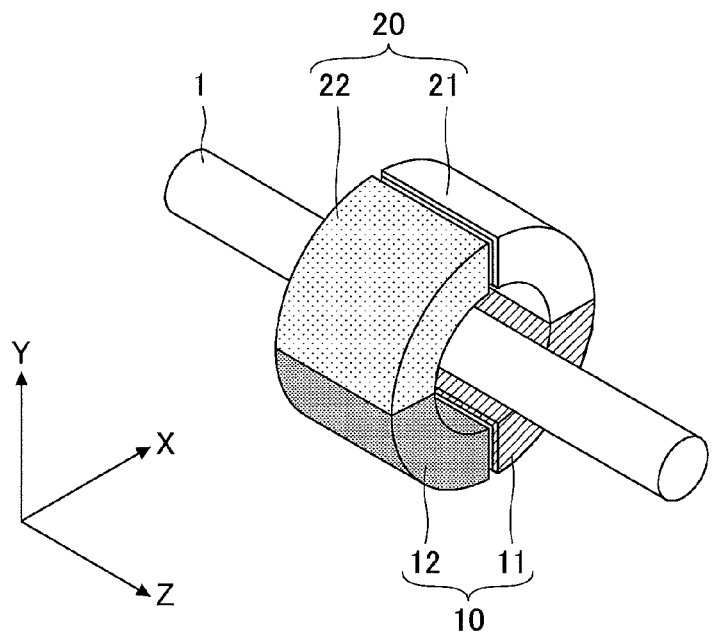
FIG. 2 is a perspective view of cores of the current sensor illustrated in FIG. 1.
FIG. 3 is a table illustrating the results of simulating the output of the current sensor of the first embodiment.

FIG. 1 is a diagram illustrating a current sensor 100 according to a first embodiment. FIG. 2 is a perspective view of cores 10 and 20 of the current sensor 100. In FIG. 1 and FIG. 2, an X-Y-Z coordinate system, which is a Cartesian coordinate system, is defined as illustrated.

The current sensor 100 includes the cores 10 and 20, Hall elements 30 and 40 and a differential amplifier 50.

The cores 10 and 20 are provided so as to form an annular shape around a wire 1 through which an electric current flows. The core 10 includes core parts 11 and 12. The core 20 includes core parts 21 and 22. The core parts 11 and 22 are provided at positions symmetric with respect to the wire 1 serving as an axis of symmetry. The core parts 12 and 21 are provided at positions symmetric with respect to the wire 1 serving as an axis of symmetry.

The core parts 11, 12, 21 and 22 are provided so as to form an annular shape as illustrated in FIG. 2.

The core 10 is divided in half into the core parts 11 and 12. The core 10 is an example of a first magnetic core, and the core parts 11 and 12 are an example of a pair of first magnetic core parts. Each of the core parts 11 and 12 is a member having a quarter annular shape. The core parts 11 and 12 are equal in size and shape to each other.

The core parts 11 and 12 are fixed inside a housing (not graphically represented) so as to form a semi-annular shape as illustrated in FIG. 1 and FIG. 2. Therefore, the core 10 has a semi-annular shape.

Similar to the core 10, the core 20 is divided in half into the core parts 21 and 22. The core 20 is an example of a second magnetic core, and the core parts 21 and 22 are an example of a pair of second magnetic core parts. Each of the core parts 21 and 22 is a member having a quarter annular shape. The core parts 21 and 22 are equal in size and shape to each other.

Furthermore, the size and shape of the core parts 21 and 22 are equal to the size and shape of the core parts 11 and 12.

The core parts 21 and 22 are fixed inside the housing (not illustrated) so as to form a semi-annular shape as illustrated in FIG. 1 and FIG. 2. Therefore, the core 20 has a semi-annular shape.

As illustrated in FIG. 1 and FIG. 2, the cores 10 and 20 are fixed so as to form an annular shape. The cores 10 and 20 form an annular magnetic core.

Magnetic materials such as permalloy, ferrite, cold-rolled sheet steel, and highly permeable nanocrystalline materials may be used for the cores 10 and 20.

The Hall element 30 is provided in a gap between the core parts 11 and 12. The Hall element 30 detects the magnetic flux density of a magnetic flux generated in the core parts 11 and 12 by an electric current flowing through the wire 1. The Hall element 30 is connected to the non-inverting input (+) of the differential amplifier 50.

The Hall element 40 is provided in a gap between the core parts 21 and 22. The Hall element 40 detects the magnetic flux density of a magnetic flux generated in the core parts 21 and 22 by an electric current flowing through the wire 1. The Hall element 40 is connected to the inverting input (−) of the differential amplifier 50.

The differential amplifier 50 outputs a voltage that represents the difference between a voltage input to the non-inverting input from the Hall element 30 and a voltage input to the inverting input from the Hall element 40 as a differential output. The output terminal of the differential amplifier 50 is connected to an output terminal 51 of the current sensor 100.

In the current sensor 100 as described above, when an electric current flows through the wire 1 in the positive direction of the Z-axis, a magnetic field in a direction following the right-hand rule is generated inside the cores 10 and 20. By obtaining a differential voltage Vs of the voltage values that the Hall elements 30 and 40 output with the generation of a magnetic field in the differential amplifier 50, it is possible to measure the value of the electric current flowing through the wire 1 in accordance with the differential voltage Vs.

FIG. 3 is a table illustrating the results of simulating the output of the current sensor 100 of the first embodiment. FIG. 3 illustrates the simulation results of magnetic flux density and the effect of disturbance magnetic flux density. Magnetic flux density at a full-scale current value ((mT) at FS (Full Scale)) and a value obtained by dividing magnetic flux by a current value (mT/A) are illustrated as the magnetic flux density. In FIG. 3, the full-scale current value is 50 A. Therefore, the value obtained by dividing magnetic flux by a current value (mT/A) is one-fiftieth (1/50) of the magnetic flux density at a full-scale current value ((mT) at FS).

The effect of disturbance magnetic flux density is an effect at the time of applying a magnetic flux density of 1 mT in the positive direction of the X-axis as a disturbance.

The cores 10 and 20 are placed with the interval between the core parts 11 and 12 and the interval between the core parts 21 and 22 both being 1.4 mm and the interval between the core parts 11 and 21 and the interval between the core parts 12 and 22 both being 0.05 mm.

The width (the length along the Z-axis) of each of the cores 10 and 20 is 17 mm. The inside diameter and the outside diameter of the annular shape of the cores 10 and 20 are 8 mm and 14 mm, respectively.

For comparison, FIG. 3 also illustrates simulation results in a current sensor that detects an electric current with the Hall element 30 alone by removing the Hall element 40 and integrating the core parts 21 and 22 of the core 20 into a single structure.

As illustrated in FIG. 3, according to the current sensor for comparison, the magnetic flux densities are 34.1 (mT) at FS and 0.68 (mT/A) and the effect of disturbance magnetic flux density is 1.130.

On the other hand, according to the current sensor 100 of the first embodiment, the magnetic densities obtained with only one of the cores 10 and 20 are 19.4 (mT) at FS and 0.388 (mT/A), and the effect of disturbance magnetic flux density is 4.680. Furthermore, according to the differential output by the cores 10 and 20, the magnetic flux densities are 38.8 (mT) at FS and 0.776 (mT/A), and the effect of disturbance magnetic flux density is canceled to zero.

Thus, it has been found that the current sensor 100 of the first embodiment is capable of detecting a greater magnetic flux density and is less susceptible to disturbance magnetic flux density because of differential detection.

Figure 4:
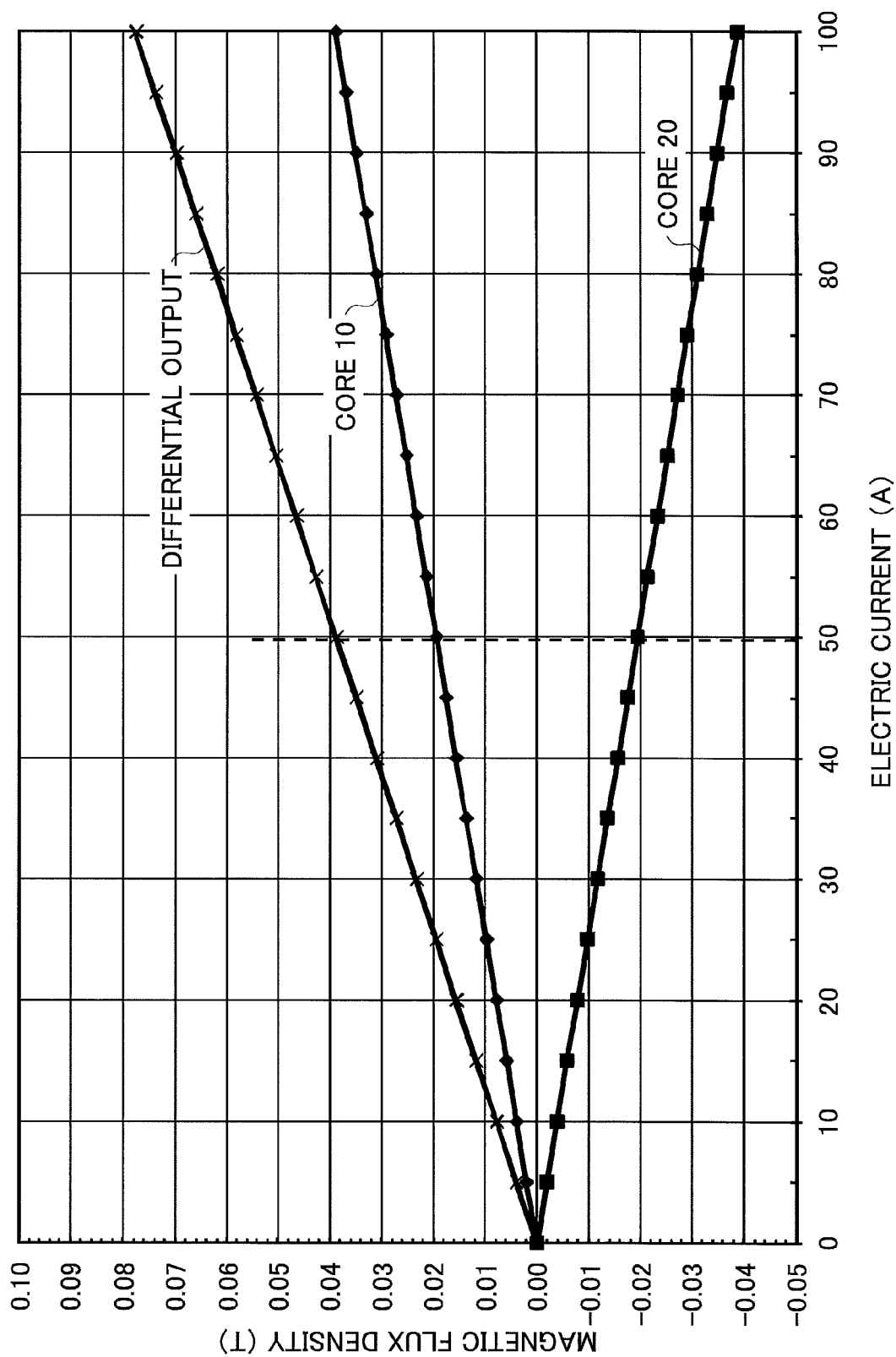
FIG. 4 is a graph illustrating the relationship between the magnetic flux density and the electric current detected in the current sensor of the first embodiment.

The magnetic flux densities obtained by this simulation are as illustrated in FIG. 4.

FIG. 4 is a graph illustrating the relationship between the electric current and the magnetic flux density detected in the current sensor 100 of the first embodiment. In FIG. 4, the horizontal axis represents electric current (A) and the vertical axis represents magnetic flux density (T).

As illustrated in FIG. 4, the magnetic flux densities detected in the core 10 and the core 20, which are proportional to the current value, are merely different in positivity/negativity sign and are equal in absolute value. Therefore, the differential output (the output of the core 10−the output of the core 20) is twice the output of the core 10 or 20 alone.

Figure 5:
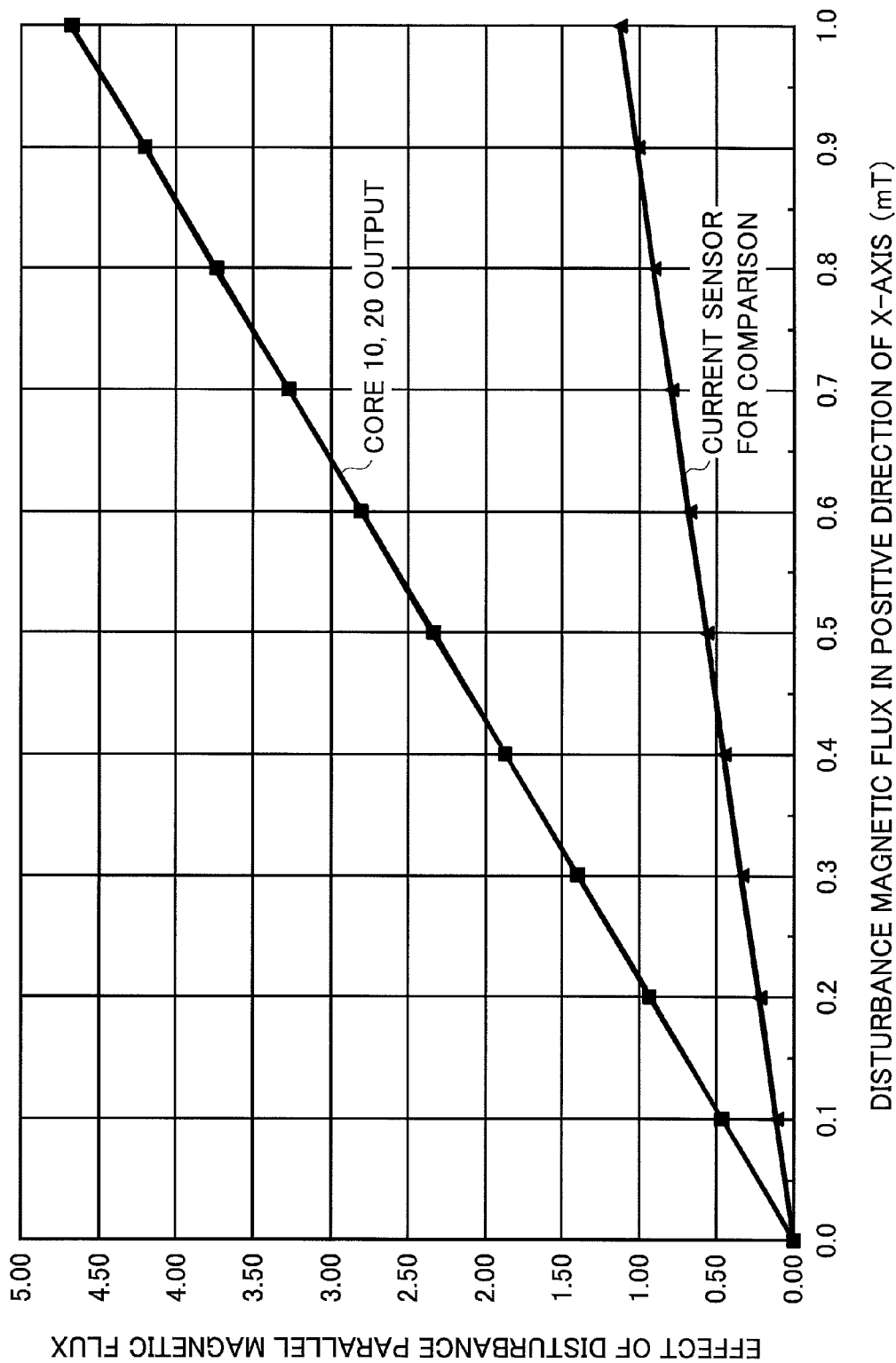
FIG. 5 is a graph illustrating the effect of disturbance magnetic flux density.

FIG. 5 is a graph illustrating the effect of disturbance magnetic flux density. In addition to the magnetic flux density of each of the cores 10 and 20 of the current sensor 100, the magnetic flux density detected in the current sensor for comparison also is illustrated in FIG. 5.

As illustrated in FIG. 5, the magnetic flux density of each of the cores 10 and 20 of the current sensor 100 presents the characteristic of linearly increasing with an increase in the magnetic flux in the positive direction of the X-axis. Likewise, the magnetic flux density in the core of the current sensor for comparison also presents the characteristic of linearly increasing with an increase in the magnetic flux in the positive direction of the X-axis. The value of the magnetic flux density in the core of the current sensor for comparison, however, is approximately a quarter (1/4) of the value of the magnetic flux density of each of the cores 10 and 20 of the current sensor 100.

Next, the results of actual measurements in the current sensor 100 of the first embodiment are described with reference to FIG. 6, FIG. 7 and FIGS. 8A and 8B.

Figure 6:
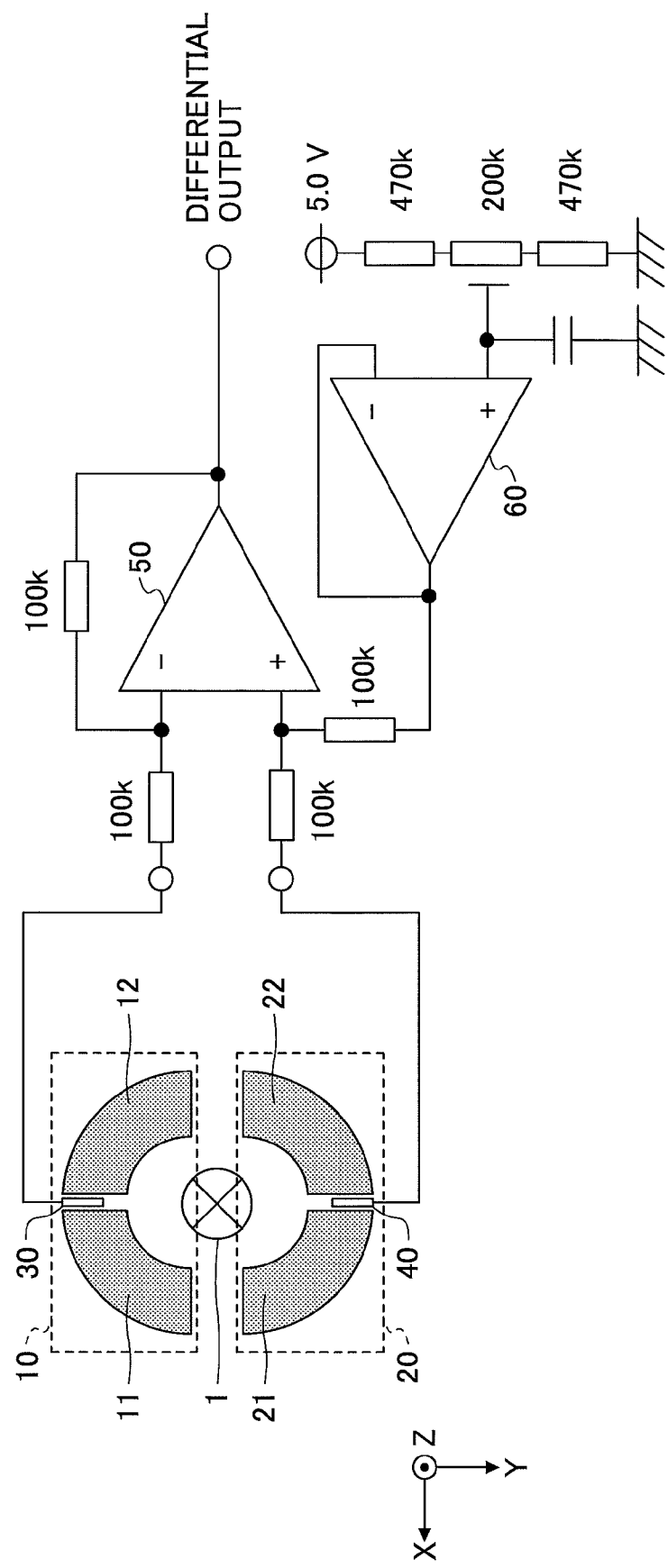
FIG. 6 is a diagram illustrating a circuit for measuring linearity and hysteresis in the current sensor of the first embodiment.

FIG. 6 is a diagram illustrating a circuit for measuring linearity and hysteresis in the current sensor 100 of the first embodiment.

Referring to FIG. 6, an operational amplifier 60 is connected to the inverting input side of the differential amplifier 50 of the current sensor 100. Furthermore, resistors and a capacitor are connected as illustrated in FIG. 6. The resistance value of each resistor is as illustrated in FIG. 6.

FIG. 7 is a table illustrating the linearity and hysteresis measured in the current sensor 100 of the first embodiment. FIG. 7 also illustrates the target values of linearity error and hysteresis, and the linearity and hysteresis measured with the core 10 or 20 alone.

FIG. 7 illustrates that, compared with a current sensor for comparison, the current sensor 100 achieves a value closer to the target value with respect to each of linearity error and hysteresis. The output of the core 10 or 20 alone indicates the output of the Hall element 30 or 40 alone.

It is found that the current sensor 100 is improved in linearity, in other words, reduced in errors, and reduced in hysteresis by obtaining the differential output of the Hall elements 30 and 40, compared with the case of employing the output of the Hall element 30 or 40 alone.

Figure 8A:
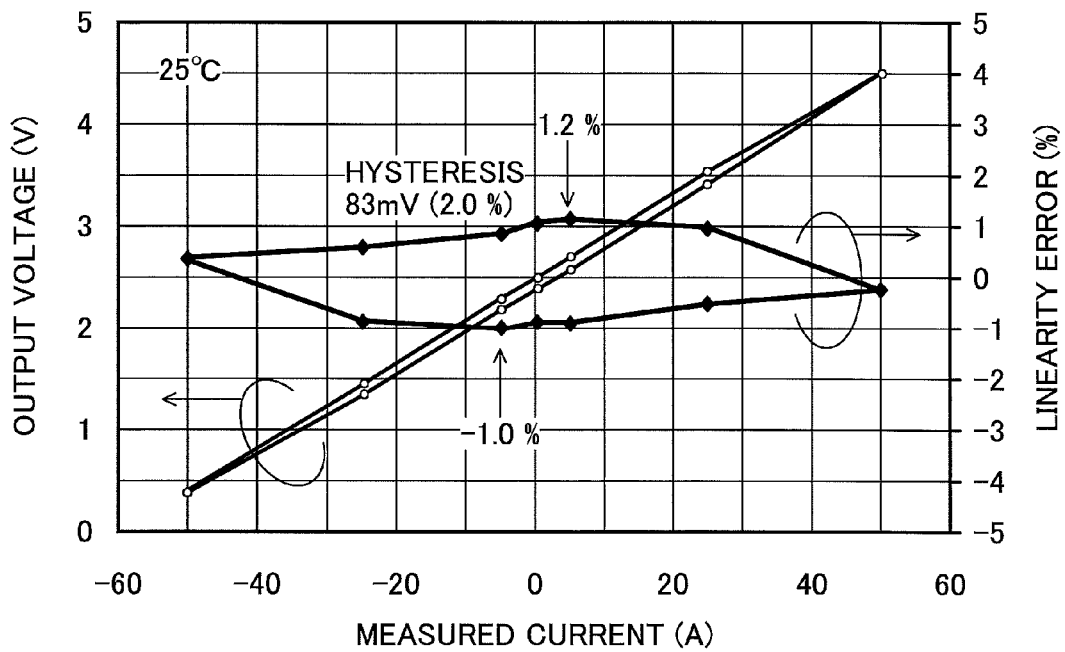
FIGS. 8A and 8B are graphs for illustrating the hysteresis characteristics of electric current and linearity in the current sensor of the first embodiment.
Figure 8B:
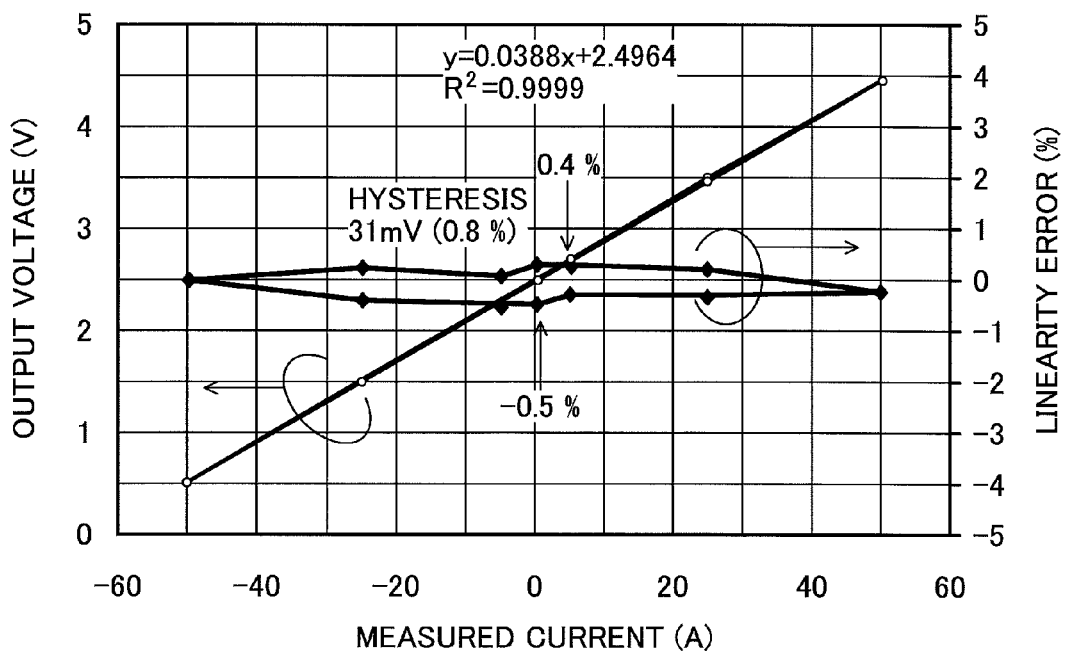

FIGS. 8A and 8B are graphs for illustrating the hysteresis characteristics of electric current and linearity in the current sensor 100 of the first embodiment. FIG. 8A illustrates hysteresis characteristics in a current sensor for comparison, in which the Hall element 40 is removed and the core parts 21 and 22 of the core 20 are integrated into a single structure. FIG. 8B illustrates hysteresis characteristics in the current sensor 100.

The comparison of FIGS. 8A and 8B illustrates that the current sensor 100 (FIG. 8B) is reduced in hysteresis compared with the current sensor for comparison (FIG. 8A).

It is believed that this reduction in hysteresis is due to the reduction in the size of a magnetic field inside the core parts 11, 12, 21 and 22 caused by the division of the core into four equal parts.

As described above, the current sensor 100 of the first embodiment is found to be more resistant to disturbance than the current sensor for comparison.

It is believed that the result showing resistance to disturbance has thus been obtained because of improvement in characteristics due to use of the four core parts 11, 12, 21 and 22 into which the core is equally divided.

Thus, according to the first embodiment, it is possible to provide the current sensor 100 whose characteristics are easily adjustable.

Use of a relatively soft material such as a highly permeable nanocrystalline material as the cores 10 and 20 has the advantage that the contactability of a part of the core 10 and a part of the core 20 that are opposed to each other is improved to improve the characteristics of the current sensor 100. The soft material such as a highly permeable nanocrystalline material may be used for the opposed parts alone and a material that is lower in cost may be used for other parts of the cores 10 and 20.

Second Embodiment

Figure 9:
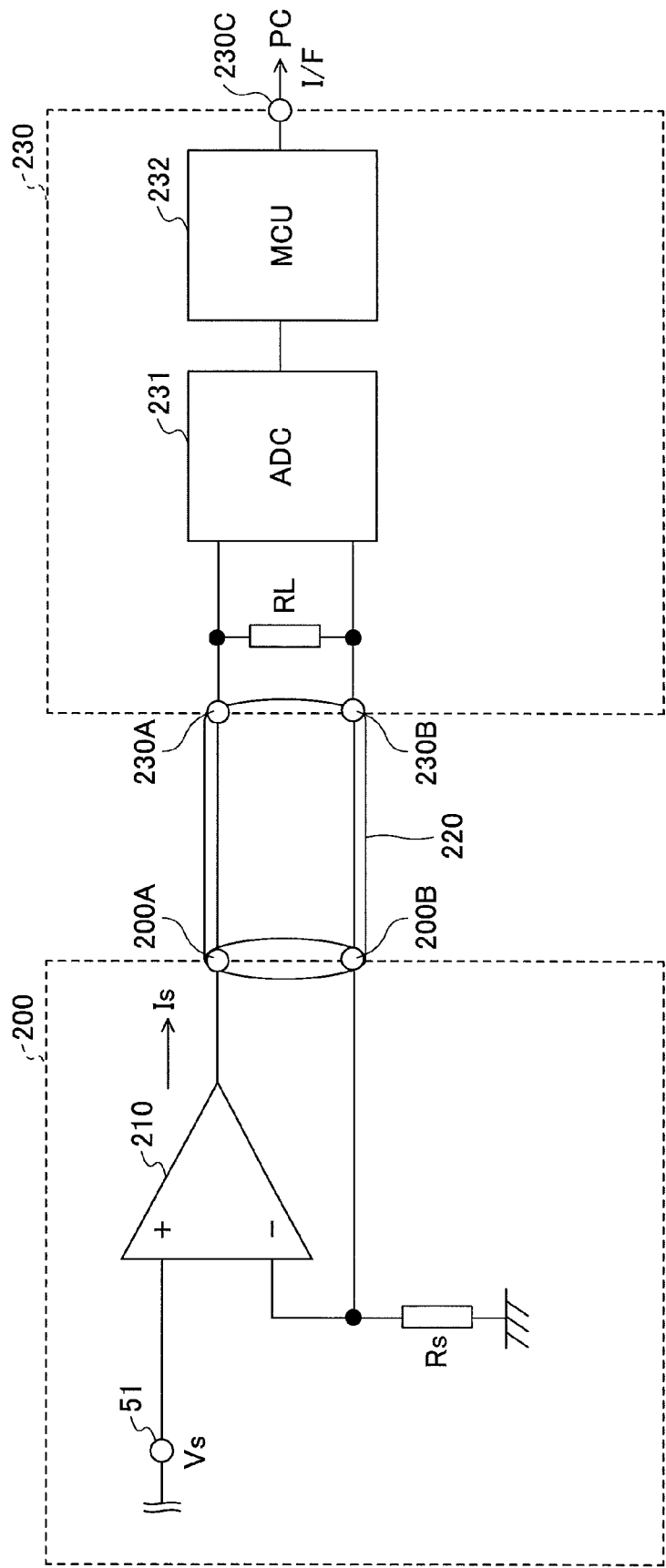
FIG. 9 is a diagram illustrating a current sensor according to a second embodiment connected to a control circuit.

FIG. 9 is a diagram illustrating a current sensor 200 according to a second embodiment connected to a control circuit 230.

FIG. 9 illustrates part of the current sensor 200 outside the output terminal 51. Like in the current sensor 100 illustrated in FIG. 1, the differential amplifier 50 and the Hall elements 30 and 40 are connected to the output terminal 51, the Hall element 30 is provided between the core parts 11 and 12 of the core 10, and the Hall element 40 is provided between the core parts 21 and 22 of the core 20.

An operational amplifier 210 is connected to the output terminal 51 of the current sensor 100 of the first embodiment to form the current sensor 200 of the second embodiment.

The operational amplifier 210 includes a non-inverting input connected to the output terminal 51 and an inverting input grounded via a resistor Rs and connected to an output terminal 200B. Furthermore, the operational amplifier 210 includes an output terminal connected to an output terminal 200A. The output terminals 200A and 200B are a pair of output terminals of the current sensor 200 of the second embodiment.

The output terminals 200A and 200B are connected to the control circuit 230 via a cable 220. The control circuit 230 serves as an interface (I/F) between the current sensor 200 and an information processing apparatus such as a personal computer (PC).

The control circuit 230 includes input terminals 230A and 230B, an output terminal 230C, a resistor RL, an analog-to-digital converter (ADC) 231, and a micro controller unit (MCU) 232. For example, a microcomputer may be used as the MCU 232.

The cable 210 includes a pair of signal lines. One of the signal lines connects the output terminal 200A and the input terminal 230A. The other of the signal lines connects the output terminal 200B and the input terminal 230B.

The resistor RL is connected between the input terminals 230A and 230B. The ADC 231 and the MCU 232 are connected in this order between the input terminals 230A and 230B and the output terminal 230C. By way of example, the output terminal 230C is connected to a PC.

The current sensor 200 outputs an electric current Is proportional to the differential voltage Vs from the operational amplifier 210. The current value is determined by Vs/Rs.

The MCU 232 of the control circuit 230 detects the same voltage value as the differential voltage Vs inside the current sensor 200 by equalizing the resistance value of the resistor RL of the control circuit 230 with the resistance value of the resistor RL of the current sensor 200.

Therefore, it is possible to monitor the value of an electric current flowing through the wire 1 by detecting the differential voltage Vs of the current sensor 200 in the PC connected to the control circuit 230.

Thus, according to the second embodiment, it is possible to provide the current sensor 200 whose characteristics are easily adjustable, and it is possible to provide the current sensor 200 capable of outputting a differential output from the differential amplifier 50 as an electric current value by converting the differential output into an electric current.

Third Embodiment

Figure 10:
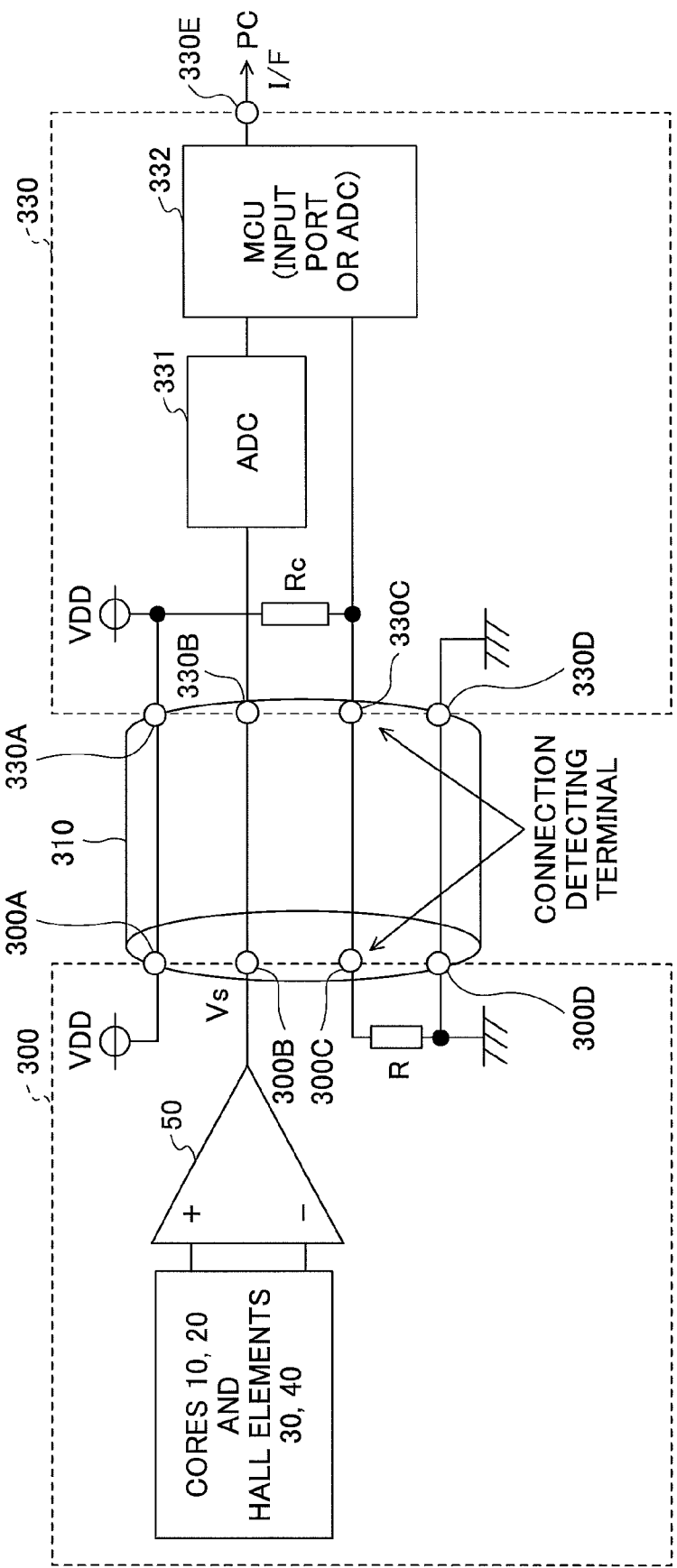
FIG. 10 is a diagram illustrating a current sensor according to a third embodiment connected to a control circuit.

FIG. 10 is a diagram illustrating a current sensor 300 according to a third embodiment connected to a control circuit 330. In FIG. 10, the cores 10 and 20 and the Hall elements 30 and 40 (FIG. 1) are illustrated together as a block, and the differential amplifier 50 is connected to the output side of the block representing the cores 10 and 20 and the Hall elements 30 and 40.

In addition to the cores 10 and 20, the Hall elements 30 and 40, and the differential amplifier 50, the current sensor 300 of the third embodiment includes terminals 300A, 300B, 300C and 300D.

The terminal 300A is connected to a power supply VDD. The terminal 300B is connected to the output terminal of the differential amplifier 50. The terminal 300C is grounded via a resistor R. The terminal 300D is grounded.

Furthermore, the control circuit 330 includes terminals 330A, 330B, 330C, 330D and 330E, an ADC 331, an MCU 332, and a resistor Rc.

The terminal 330A is connected to the power supply VDD and one end of the resistor Rc. The terminal 330B is connected to an input terminal of the ADC 331. The terminal 330C is connected to an input terminal of the MCU 332 and the other end of the resistor Rc. The terminal 330D is grounded. The terminal 330E is connected to an output terminal of the MCU 332. A PC is connected to the terminal 330E.

The ADC 331 includes an input terminal connected to the terminal 330B and an output terminal connected to another input terminal of the MCU 332. The MCU 332 includes an input terminal connected to the terminal 330C, another input terminal connected to the ADC 331, and an output terminal connected to the terminal 330E. The resistor Rc is connected between the terminals 330A and 330C.

By connecting the control circuit 330 to the current sensor 300 via a cable 310 including four interconnects, the ADC 331 detects the differential output Vs of the current sensor 300. The ADC 331 detects a voltage drop and noise contamination in the cable 310.

Furthermore, by connecting the control circuit 330 to the current sensor 300, the terminal 330C is connected to the terminal 300C via the cable 310, so that the MCU 332 can detect a voltage drop at the terminal 330C.

The MCU 332 may output a predetermined voltage to the terminal 330C without using the resistor Rc before the control circuit 330 is connected to the current sensor 300, and detect a connection of the control circuit 330 to the current sensor 300 by detecting a voltage drop that occurs at the terminal 330C when the terminal 330C is connected to the terminal 300C.

Thus, according to the third embodiment, it is possible to provide the current sensor 300 whose characteristics are easily adjustable, and it is possible to detect a voltage drop and noise contamination in the cable 310 and detect a connection to the current sensor 300 on the control circuit 330 side.

Fourth Embodiment

Figure 11:
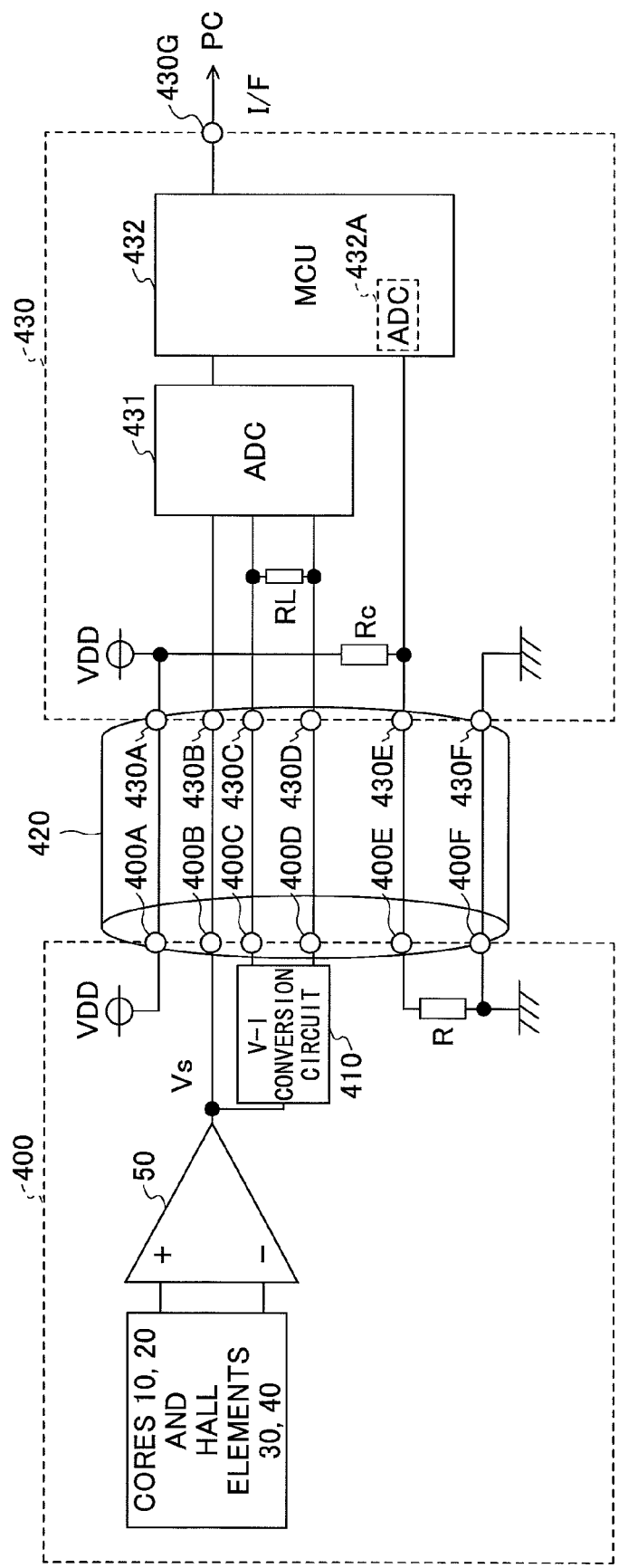
FIG. 11 is a diagram illustrating a current sensor according to a fourth embodiment connected to a control circuit.

FIG. 11 is a diagram illustrating a current sensor 400 according to a fourth embodiment connected to a control circuit 430. In FIG. 11, the cores 10 and 20 and the Hall elements 30 and 40 (FIG. 1) are illustrated together as a block, and the differential amplifier 50 is connected to the output side of the block representing the cores 10 and 20 and the Hall elements 30 and 40.

In addition to the cores 10 and 20, the Hall elements 30 and 40, and the differential amplifier 50, the current sensor 400 of the fourth embodiment includes terminals 400A, 400B, 400C, 400D, 400E and 400F and a V-I conversion circuit 410.

The terminal 400A is connected to the power supply VDD. The terminal 400B is connected to the output terminal of the differential amplifier 50. The terminal 400C is connected to an output terminal of the V-I conversion circuit 410. The terminal 400D is connected to another output terminal of the V-I conversion circuit 410.

The terminal 400E is grounded via the resistor R. The terminal 400F is grounded.

The V-I conversion circuit 410 includes an input terminal connected to the output terminal of the differential amplifier 50, an output terminal connected to the terminal 400C, and another output terminal connected to the terminal 400D. The V-I conversion circuit 410 converts the output of the differential amplifier 50 (voltage) into an electric current and outputs the converted output.

Furthermore, the control circuit 430 includes terminals 430A, 430B, 430C, 430D, 430E and 430F, an ADC 431, an MCU 432, the resistors Rc and RL.

The terminal 430A is connected to the power supply VDD and one end of the resistor Rc. The terminal 430B is connected to an input terminal (a terminal for inputting the differential voltage Vs) of the ADC 431. The terminal 430C is connected to one of the current inputting terminals of the ADC 431 and one end of the resistor RL. The terminal 430D is connected to the other of the current inputting terminals of the ADC 431 and the other end of the resistor RL.

The terminal 430E is connected to an input terminal of the MCU 432 and the other end of the resistor Rc. The terminal 430F is grounded. The terminal 430G is connected to an output terminal of the MCU 432. A PC is connected to the terminal 430G.

The ADC 431 includes a voltage inputting terminal connected to the terminal 430B, a current inputting terminal connected to the terminal 430C, another current inputting terminal connected to the terminal 430D, and an output terminal connected to another input terminal of the MCU 432.

The MCU 432 includes an input terminal connected to the terminal 430E, another input terminal connected to the output terminal of the ADC 431, and an output terminal connected to the terminal 430G. The resistor Rc is connected between the terminals 430A and 430E. The resistor RL is connected between the terminals 430C and 430D.

Furthermore, the MCU 432 includes a built-in ADC 432A at the input terminal connected to the terminal 430E. The ADC 432A performs digital conversion on the voltage input from the current sensor 400.

By connecting the control circuit 430 to the current sensor 400 via a cable 420 including six interconnects, the ADC 431 detects the differential output Vs from the differential amplifier 50 of the current sensor 400 and also detects an electric current output from the V-I conversion circuit 410.

The ADC 431 detects a voltage drop and noise contamination in the cable 420 and detects the output of the differential amplifier 50 as an electric current value.

Furthermore, by connecting the control circuit 430 to the current sensor 400, the terminal 430E is connected to the terminal 400E via the cable 420, so that the MCU 432 detects a voltage drop at the terminal 430E.

Thus, according to the fourth embodiment, it is possible to provide the current sensor 400 whose characteristics are easily adjustable, and it is possible to detect a voltage drop and noise contamination in the cable 420 and detect a connection to the current sensor 400 on the control circuit 430 side.

Furthermore, the current sensor 400 of the fourth embodiment detects the differential output (Vs) and detects the value of an electric current into which the differential output (Vs) is converted. Therefore, it is possible to monitor the value of an electric current flowing through the wire 1 in a voltage value and an electric current value in the PC connected to the control circuit 430.

Fifth Embodiment

Figure 12:
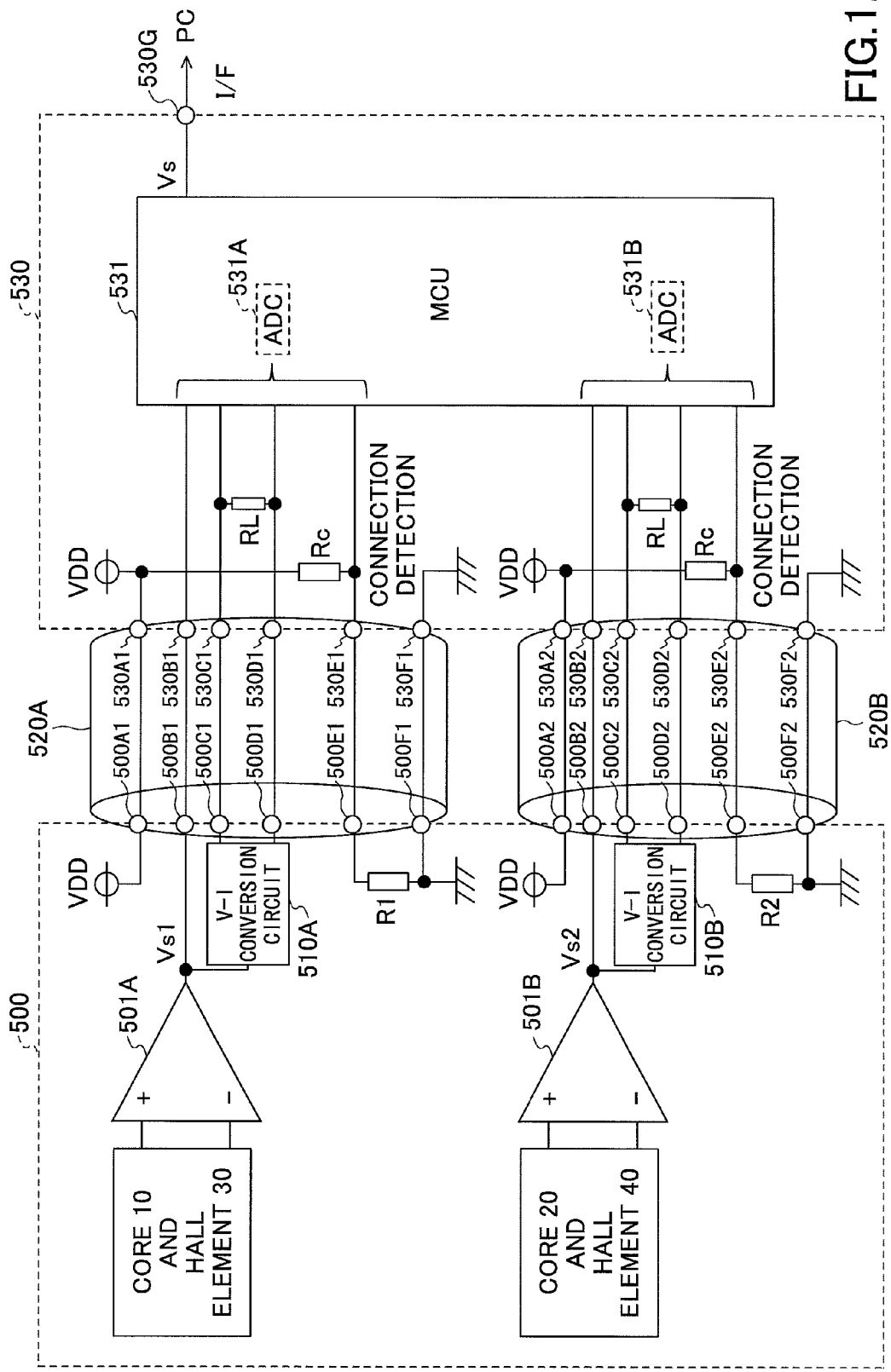
FIG. 12 is a diagram illustrating a current sensor according to a fifth embodiment connected to a control circuit.

FIG. 12 is a diagram illustrating a current sensor 500 according to a fifth embodiment connected to a control circuit 530.

In FIG. 12, the core 10 and the Hall element 30 (FIG. 1) are illustrated together as a block, and an operational amplifier 501A is connected to the output side of the block representing the core 10 and the Hall element 30. Likewise, the core 20 and the Hall element 40 (FIG. 1) are illustrated together as a block, and an operational amplifier 501B is connected to the output side of the block representing the core 20 and the Hall element 40.

In addition to the cores 10 and 20, the Hall elements 30 and 40, and the operational amplifiers 501A and 501B, the current sensor 500 of the fifth embodiment includes terminals 500A1, 500B1, 500C1, 500D1, 500E1, 500F1, 500A2, 500B2, 500C2, 500D2, 500E2 and 500F2, and V-I conversion circuits 510A and 510B.

The current sensor 500 of the fifth embodiment is configured so as to be able to separately output a magnetic flux detected by the Hall element 30 and a magnetic flux detected by the Hall element 40. Therefore, the current sensor 500 includes the two operational amplifiers 501A and 501B, and the output side of the operational amplifiers 501A and 501B is divided into two systems.

Furthermore, instead of a differential output, the current sensor 500 inputs voltages or electric currents that represent the magnetic flux densities detected by the Hall elements 30 and 40 to an MCU 531 from the circuit divided into two systems. A differential output is generated inside the MCU 531.

The terminal 500A1 is connected to the power supply VDD. The terminal 500B1 is connected to an output terminal of the operational amplifier 501A. The terminal 500C1 is connected to an output terminal of the V-I conversion circuit 510A. The terminal 500D1 is connected to another output terminal of the V-I conversion circuit 510A.

The terminal 500E1 is grounded via a resistor R1. The terminal 500F1 is grounded.

The V-I conversion circuit 510A includes an input terminal connected to the output terminal of the operational amplifier 501A, an output terminal connected to the terminal 500C1, and another output terminal connected to the terminal 500D1. The V-I conversion circuit 510A converts the output of the operational amplifier 501A into an electric current and outputs the converted output.

The terminal 500A2 is connected to the power supply VDD. The terminal 500B2 is connected to an output terminal of the operational amplifier 501B. The terminal 500C2 is connected to an output terminal of the V-I conversion circuit 510B. The terminal 500D2 is connected to another output terminal of the V-I conversion circuit 510B.

The terminal 500E2 is grounded via a resistor R2. The terminal 500F2 is grounded.

The V-I conversion circuit 510B includes an input terminal connected to the output terminal of the operational amplifier 501B, an output terminal connected to the terminal 500C2, and another output terminal connected to the terminal 500D2. The V-I conversion circuit 510B converts the output of the operational amplifier 501B into an electric current and outputs the converted output.

Furthermore, the control circuit 530 includes terminals 530A1, 530B1, 530C1, 530D1, 530E1, 530F1, 530A2, 530B2, 530C2, 530D2, 530E2 and 530F2, a terminal 530G, the MCU 531, and two sets of the resistors Rc and RL.

The MCU 531 includes built-in ADCs 531A and 531B at input terminals. The MCU 531 performs digital conversion on the voltages and electric currents of two systems input from the current sensor 500, and generates a differential output of the digital outputs of the two systems.

The terminal 530A1 is connected to the power supply VDD and one end of the resistor Rc. The terminal 530B1 is connected to an input terminal (a terminal for inputting an output voltage Vs1 of the operational amplifier 501A) of the MCU 531. The terminal 530C1 is connected to one of the current inputting terminals of the MCU 531 and one end of the resistor RL. The terminal 530D1 is connected to the other of the current inputting terminals of the MCU 531 and the other end of the resistor RL.

The terminal 530E1 is connected to a connection detecting terminal of the MCU 531 and the other end of the resistor Rc. The terminal 530F1 is grounded. The terminal 530G is connected to an output terminal of the MCU 531. A PC is connected to the terminal 530G.

The above-described connections are connections at input terminals corresponding to the operational amplifier 501A in the MCU 531.

The terminals 530A2, 530B2, 530C2, 530D2, 530E2 and 530F2 are connected to input terminals corresponding to the operational amplifier 501B in the MCU 531 in the same manner as the terminals 530A1, 530B1, 530C1, 530D1, 530E1 and 530F1 are connected to the input terminals corresponding to the operational amplifier 501B in the MCU 531 as described above.

Connecting the control circuit 530 to the current sensor 500 via cables 520A and 520b each including six interconnects makes it possible to detect the differential voltage Vs of the output voltages Vs1 and Vs2 of the operational amplifiers 501A and 501B of the current sensor 500 and detect the electric currents output from the V-I conversion circuits 510A and 510B of the current sensor 500 in the MCU 531.

That is, in the MCU 531, it is possible to detect a voltage drop and noise contamination in the cables 520A and 520B and detect the outputs of the operational amplifiers 501A and 501B in an electric current value.

Furthermore, connecting the control circuit 530 to the current sensor 500 causes the terminals 530E1 and 530E2 to be connected to the terminals 500E1 and 500E2 via the cables 520A and 520B, respectively, thus making it possible for the MCU 531 to detect a voltage drop at the terminals 530E1 and 530E2.

Thus, according to the fifth embodiment, it is possible to detect a voltage drop and noise contamination in the cables 520A and 520B and detect a connection to the current sensor 500 on the control circuit 530 side.

Furthermore, it is possible to monitor the value of an electric current flowing through the wire 1 in a voltage value and an electric current value in the PC connected to the control circuit 530.

Furthermore, the differential output of digital signals of two systems is generated after performing digital conversion on the control circuit 530 side. Therefore, it is possible to adjust signal gain and thus correct a differential output inside the MCU 531.

Accordingly, it is possible to provide the current sensor whose characteristics are easily adjustable.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A current sensor, comprising:
a semi-annular first magnetic core comprising a pair of first magnetic core parts each having a quarter annular shape, provided around a wire in which an electric current flows;
a first sensor provided in a gap between the first magnetic core parts and configured to detect a magnetic flux;
a semi-annular second magnetic core comprising a pair of second magnetic core parts each having a quarter annular shape, provided around the wire, wherein the second magnetic core forms an annular magnetic core with the first magnetic core;
a second sensor provided in a gap between the second magnetic core parts and configured to detect a magnetic flux; and a differential output part configured to output a differential output of a first output of the first sensor and a second output of the second sensor.

2. The current sensor as claimed in claim 1, wherein the first magnetic core parts and the second magnetic core parts are equal in size and shape to one another.

3. The current sensor as claimed in claim 1, further comprising:
a current output part configured to output the differential output of the differential output part as an electric current.

4. The current sensor as claimed in claim 1, further comprising:
a detection terminal to be connected to a circuit when the circuit is connected to the current sensor along with the differential output part for detecting a connection of the circuit to the current sensor on a side of the circuit; and
a resistor connected between the detection terminal and a reference electric potential.

5. A current sensor, comprising:
a pair of first magnetic core parts each having a quarter annular shape that form a semi-annular first magnetic core provided around a wire in which an electric current flows;
a first sensor provided in a gap between the first magnetic core parts, configured to detect a magnetic flux and output a first output indicating the detected magnetic flux;
a pair of second magnetic core parts each having a quarter annular shape that form a semi-annular second magnetic core provided around the wire, wherein the second magnetic core forms an annular magnetic core with the first magnetic core; and
a second sensor provided in a gap between the second magnetic core parts, configured to detect a magnetic flux and output a second output indicating the detected magnetic flux.

6. The current sensor as claimed in claim 5, further comprising:
a first conversion part configured to convert the first output into an electric current and output the converted first output; and
a second conversion part configured to convert the second output into an electric current and output the converted second output.

* * * * *